United States Patent [19]

Salina et al.

[11] Patent Number: 5,340,993
[45] Date of Patent: Aug. 23, 1994

[54] OPTOCOUPLER PACKAGE WITH INTEGRAL VOLTAGE ISOLATION BARRIER

[75] Inventors: John E. Salina, Phoenix; Clem H. Brown, Scottsdale, both of Ariz.

[73] Assignee: Motorola, Inc., Schaumburg, Ill.

[21] Appl. No.: 54,482

[22] Filed: Apr. 30, 1993

[51] Int. Cl.$^5$ ............................................. G02B 27/00
[52] U.S. Cl. ........................................ 250/551; 257/82
[58] Field of Search ................... 250/551; 257/80, 81, 257/82; 340/619; 307/311

[56] References Cited

U.S. PATENT DOCUMENTS

| | | | |
|---|---|---|---|
| 4,054,801 | 10/1977 | Breval et al. | 250/551 |
| 4,309,605 | 1/1982 | Okabe | 250/239 |
| 4,322,628 | 3/1982 | Tanaka | 250/551 |
| 4,450,461 | 5/1984 | Cook et al. | 257/80 |
| 4,645,551 | 2/1987 | Adams et al. | 156/82 |
| 4,962,395 | 10/1990 | Baird | 340/619 |
| 4,972,089 | 11/1990 | Stevenson | 250/551 |

FOREIGN PATENT DOCUMENTS

| | | |
|---|---|---|
| 2106710 | 4/1972 | France . |
| 56-110273 | 1/1981 | Japan . |
| 60-225485 | 9/1985 | Japan . |
| 63-6883 | 12/1988 | Japan . |

*Primary Examiner*—David C. Nelms
*Attorney, Agent, or Firm*—Michael D. Bingham; Michael Waters

[57] ABSTRACT

An optocoupler package made up from a pre-assembled package having a leadframe, a voltage isolation barrier, and a body molded from a reflective plastic material. The voltage isolation barrier is fabricated as part of the body and positioned in such a way as to substantially increase the electrical flashover path between the optical source and the optical detector. An optical source mounted in the pre-assembled package subsequent to fabrication of the molded body. An optical detector is optically coupled to the optical source by reflection within the pre-assembled package, the optical detector being mounted in the pre-assembled package subsequent to fabrication of the molded body A reflective plastic cover is bonded to the pre-assembled package.

8 Claims, 1 Drawing Sheet

U.S. Patent     Aug. 23, 1994     5,340,993
FIG. 1
(PRIOR ART)
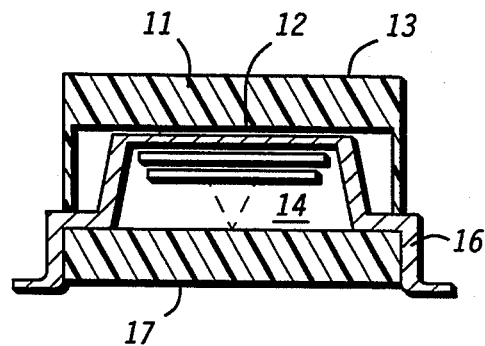
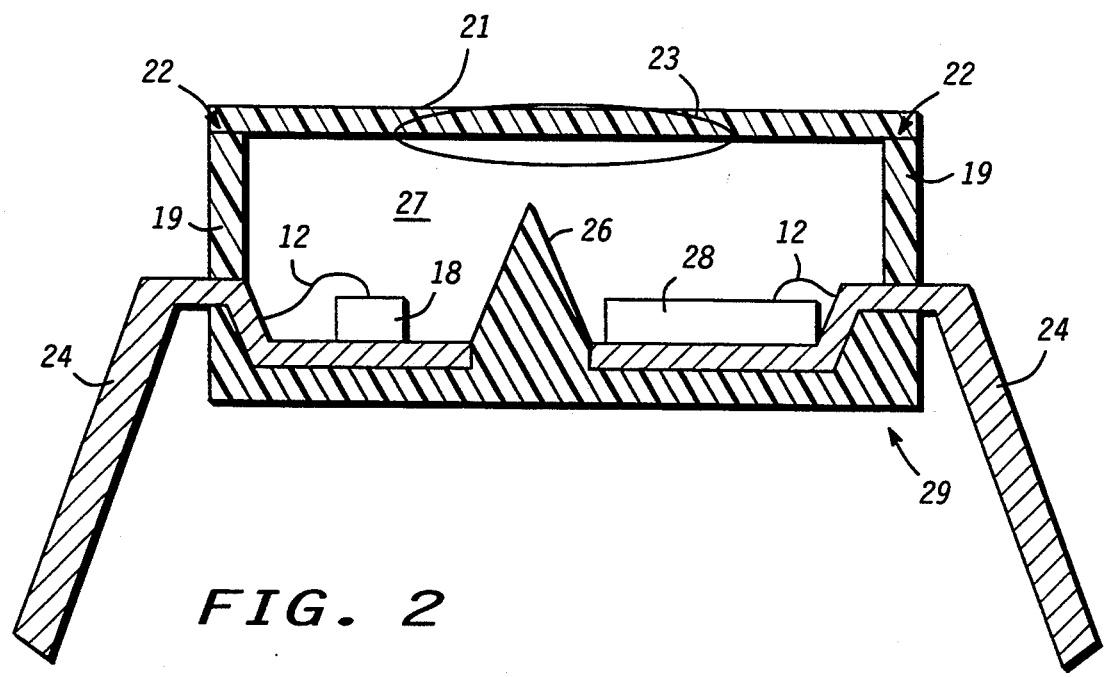
FIG. 2

OPTOCOUPLER PACKAGE WITH INTEGRAL VOLTAGE ISOLATION BARRIER

BACKGROUND OF THE INVENTION

The present invention relates, in general, to photoelectric devices, and more particularly to packages for semiconductor optical couplers.

Optocouplers are devices which contain at least one optical emitter which is optically coupled to an optical detector through some sort of electrically insulating medium. This arrangement permits the passage of information from one electrical circuit which contains the emitter, to another electrical circuit which contains the detector. A high degree of electrical isolation is maintained between the two circuits. Because this information is passed optically across an insulating gap the transfer is one way. That is the detector cannot affect the input circuit. This feature is important because the emitter may be driven by a low voltage circuit using an MPU or logic gates, while the output photo-detector may be part of a high voltage DC or AC load circuit. The optical isolation also serves to prevent damage to the input circuit caused by the relatively hostile output circuit.

Applications of this sort in which a low voltage circuit is coupled to a high voltage circuit are known as "interface" applications. Interface applications have stringent requirements for isolation voltage and minimum leakage current. As a result optocouplers may have closely defined minimum physical dimensions for spacing between low voltage and high voltage sections. These requirements are intended to guarantee safety both for equipment and for humans and as a result the requirements include dimensions for both electrical creepage and physical clearance.

The most common optocoupler outline is the dual-in-line or DIP package. This package is widely used to house integrated circuits and was readily adapted to house optocouplers. Various versions of optocoupler DIP packages having 4, 6, 8 or 16 pins are commonly manufactured. However the dual-in-line package has the disadvantage that the spacing between optical emitter and optical detector is inherently limited by the size of the package. Accordingly the internal dimensions available for electrical creepage and physical clearance are inherently limited.

According to the prior art, low cost optocoupler packages require that the device has its body molded after the process of mounting the semiconductor die and electrical connections are made. This process requires a batch processing system utilizing individual leadframes rather than a form of continuous processing. The optical path must be defined by a separate clear optical medium which is molded around the active devices and is then surrounded by a reflective package. This reflective package provides physical protection, shields external light, and may also provide an integral reflective surface to aid in light transmission. The clear optical medium largely determines the optical performance of the assembled optocoupler. Voltage isolation thus depends on the dielectric characteristics of the clear optical medium and the method by which the insulation material is placed within the optocoupler package. Typically an ultraviolet surface activation process is used to form a molecular bond between the clear optical medium and the surrounding mold compound and eliminate any path for high voltage creep. Variations in composition and amount of material applied in each unit also causes a large variation in the efficiency of the optocoupler from unit to unit.

There is a need for a method to reduce the wide range of optical performance and variation in isolation voltage within an optocoupler while providing a low cost and easily manufactured package. It would be desirable to reduce assembly cost by eliminating expensive mold presses and ultraviolet surface activation equipment, providing packages suited for assembly in a reel form rather than a batch leadframe form, and using pre-molded packages for assembly.

SUMMARY OF THE INVENTION

An optocoupler package made up from a pre-assembled package having a leadframe, a voltage isolation barrier, and a body molded from a reflective plastic material. The voltage isolation barrier is fabricated as part of the body and positioned in such a way as to substantially increase the electrical flashover path between the optical source and the optical detector. An optical source mounted in the pre-assembled package subsequent to fabrication of the molded body. An optical detector is optically coupled to the optical source by reflection within the pre-assembled package, the optical detector being mounted in the pre-assembled package subsequent to fabrication of the molded body. A reflective plastic cover is bonded to the pre-assembled package.

A method for packaging an optocoupler, in which a pre-assembled package which made up from a leadframe, a voltage isolation barrier and a body molded from a reflective plastic material is provided. Mounting an optical source and an optical detector within the pre-assembled package such that the optical detector is optically coupled to the optical source but is separated from the optical source by the voltage isolation barrier. Bonding a reflective plastic cover to the pre-assembled package.

BRIEF DESCRIPTION OF THE DRAWINGS

FIG. 1 shows a cross-section view of optocoupler package according to the prior art.

FIG. 2 shows a cross-section view of an optocoupler package as a preferred embodiment.

DETAILED DESCRIPTION OF THE DRAWINGS

FIG. 1 shows a cross-section view of an optocoupler package according to the prior art. This package is described in a Japanese patent 63-6883, "Small-Sized Photocoupler" issued Dec. 1, 1988 to Noboru Akutsu, and assigned to NEC Corporation, which is incorporated herein by reference. A leadframe 16 is mounted adjacent to a white resin package 13. A light emitting device 11 and a photo-detector 12 are mounted on leadframe 16. The cavity is filled with a transparent resin 14 and the package closed with a cap 17. Package 13 and cap 17 serve to exclude external light from the photocoupler. Light emitted from light emitting device 11 is reflected from package 13 to photo-detector 12. Light emitting device 11 and photo-detector 12 are electrically coupled to leadframe 16 which in turn electrically couples these devices to external circuitry. After assembly, leadframe 16 is modified by removing external shorting bars allowing the optocoupler to operate and providing electrical isolation between light emitting device 11 and photo detector 12.

FIG. 2 shows an optocoupler package as a preferred embodiment in accordance with the present invention. A leadframe 24 is mounted within a molded plastic package 19. An optical source 18 is bonded to leadframe 24 by a plurality of bonding wires 12, electrically coupling emitter 18 to external circuitry. Likewise an optical detector 28 is mounted on leadframe 24 and coupled thereby to external circuitry. A cavity 27 is typically left unfilled. A cap 21 is thermosonically bonded to package 19 encapsulating optical emitter 18 and optical detector 17 so as to provide physical protection and to exclude stray light. Molded plastic package 19 includes an integral voltage isolation barrier 26 formed between optical source 18 and optical detector 28. Voltage isolation barrier 26 serves to increase the length of the electrical leakage path between optical source 18 and optical detector 28. In the preferred embodiment, molded plastic package 19 and voltage isolation barrier 26 is molded from a thermoplastic material around leadframe 24 to form a pre-assembled package 29. Optical source 18 and optical detector 28 are then mounted onto leadframe 24 within pre-assembled package 29. Pre-assembled package 29 is typically provided using a reel form which facilitates handling during assembly.

In an alternative preferred embodiment, a curved reflector 23 is incorporated into cap 21 to increase the light transmission between optical source 18 and optical detector 17. Alternative embodiments in accordance with the present invention include filling cavity 27 with an optical transmission medium such as a transparent plastic, and coating the inner walls of package 19 and cap 21 with a highly reflective material such as a metal or mylar film bonded to the inner surface of cap 21. Another alternative embodiment includes a plurality of voltage isolation barriers 26 which serve to further increase the leakage path. Other embodiments include voltage isolation barrier 26 having any of a wide variety of shapes in addition to the triangular shape shown in FIG. 2 such as: square, rounded, or pointed.

By now it should be clear that the present invention provides a method to reduce the range of optical performance and variation in isolation voltage within an optocoupler while providing a low cost and easily manufactured package. The preferred embodiment reduces assembly cost by eliminating expensive mold presses and ultraviolet surface activation equipment, providing packages in a reel form rather than a batch leadframe form, and using pre-molded packages for assembly.

We claim:

1. An optocoupler package, comprising:
   a leadframe on which an optical source and an optical detector are mounted;
   a body molded from a reflective plastic material disposed about said optical source and said optical detector; and
   a voltage isolation barrier fabricated as part of the body and positioned between said optical source and said optical detector to substantially increase the electrical flashover path between the optical source and the optical detector.

2. The optocoupler package of claim 1 further comprising:
   a plastic cover having an inner surface coated with a reflective material and bonded to the package to optically couple the optical source to the optical detector by reflection.

3. The optocoupler package of claim 2 further comprising:
   a filler formed from a plastic material which is transparent to light emitted by the optical source and which fills a cavity formed by the package and the plastic cover.

4. The optocoupler package of claim 2 further comprising:
   a curved reflector molded as part of the plastic cover to facilitate light transmission between the optical source and the optical detector.

5. The optocoupler package of claim 4 wherein the curved reflector comprises a layer of metallic material which is bonded to the surface of the plastic cover.

6. The optocoupler package of claim 4 wherein the curved reflector comprises a layer of plastic material which is bonded to the surface of the plastic cover.

7. A method for packaging an optocoupler, comprising:
   providing a pre-assembled package which comprises a leadframe, a voltage isolation barrier and a body molded from a reflective plastic material;
   mounting an optical source in the pre-assembled package;
   mounting an optical detector within the pre-assembled package such that the optical detector is optically coupled to the optical source but is separated from the optical source by the voltage isolation barrier; and
   bonding a reflective plastic cover to the pre-assembled package.

8. An optocoupler package, comprising:
   a pre-assembled package comprising a leadframe, a voltage isolation barrier, and a body molded from an infra-red reflective plastic material, the voltage isolation barrier being fabricated as part of the body and positioned to substantially increase the flashover path between an optical source and an optical detector;
   an optical source mounted in the pre-assembled package;
   an optical detector optically coupled to the optical source by reflection within the pre-assembled package, the optical detector being mounted in the pre-assembled package;
   a reflective plastic cover bonded to the pre-assembled package to leave an empty cavity bounded by the pre-assembled package and the reflective plastic cover, the cavity being shielded from external light sources; and
   a curved reflector molded into the reflective plastic cover.

* * * * *